United States Patent
Okude

(10) Patent No.: US 10,530,330 B2
(45) Date of Patent: Jan. 7, 2020

(54) ELASTIC WAVE DEVICE

(71) Applicant: Murata Manufacturing Co., Ltd., Nagaokakyo-shi, Kyoto-fu (JP)

(72) Inventor: Takayuki Okude, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 98 days.

(21) Appl. No.: 15/874,916

(22) Filed: Jan. 19, 2018

(65) Prior Publication Data

US 2018/0145659 A1    May 24, 2018

Related U.S. Application Data

(63) Continuation of application No. PCT/JP2016/070593, filed on Jul. 12, 2016.

(30) Foreign Application Priority Data

Jul. 28, 2015   (JP) ................. 2015-148832

(51) Int. Cl.
*H03H 9/02*   (2006.01)
*H03H 9/145*  (2006.01)
(Continued)

(52) U.S. Cl.
CPC .... *H03H 9/02992* (2013.01); *H03H 9/02559* (2013.01); *H03H 9/145* (2013.01);
(Continued)

(58) Field of Classification Search
CPC ........... H03H 9/02559; H03H 9/02834; H03H 9/02905; H03H 9/02992; H03H 9/145;
(Continued)

(56) References Cited

U.S. PATENT DOCUMENTS 5,710,529 A * 1/1998 Sugiyama .......... H03H 9/14505
                                              310/313 R
2004/0196119 A1   10/2004 Shibahara et al.
(Continued)

FOREIGN PATENT DOCUMENTS

JP   (4) 04-091508 A  *  3/1992
JP      05-235684 A     9/1993
(Continued)

OTHER PUBLICATIONS

English language machine translation of JP 2000-261285 A, published Sep. 22, 2000, 6 pages. (Year: 2000).*
(Continued)

*Primary Examiner* — Barbara Summons
(74) *Attorney, Agent, or Firm* — Keating & Bennett, LLP

(57) ABSTRACT

A longitudinally coupled resonator elastic wave filter is disposed on a piezoelectric substrate. IDT electrodes include first and second busbars. An inorganic insulating layer is provided on at least one side in a direction perpendicular or substantially perpendicular to an elastic wave propagation direction to cover the first or second busbars, and a first wiring line is disposed on the inorganic insulating layer to extend in the elastic wave propagation direction. A second wiring line three-dimensionally crosses the first wiring line with the inorganic insulating layer interposed therebetween. The first wiring line is connected to busbars, which are connected to the same potential, by extending through the inorganic insulating layer.

15 Claims, 12 Drawing Sheets

(51) Int. Cl.
*H03H 9/25* (2006.01)
*H03H 9/64* (2006.01)

(52) U.S. Cl.
CPC ............ *H03H 9/25* (2013.01); *H03H 9/6406* (2013.01); *H03H 9/6466* (2013.01)

(58) Field of Classification Search
CPC ...... H03H 9/25; H03H 9/6406; H03H 9/6433; H03H 9/6436; H03H 9/644; H03H 9/6456; H03H 9/6466; H03H 9/6469
USPC .................................................. 333/193–196
See application file for complete search history.

(56) References Cited

U.S. PATENT DOCUMENTS

| | | |
|---|---|---|
| 2007/0018756 A1 | 1/2007 | Fujii et al. |
| 2012/0098618 A1 | 4/2012 | Tanaka |
| 2016/0094198 A1 | 3/2016 | Takamine |

FOREIGN PATENT DOCUMENTS

| | | | |
|---|---|---|---|
| JP | 2000-261285 A | * | 9/2000 |
| JP | 2004-282707 A | | 10/2004 |
| JP | 2007-174307 A | | 7/2007 |
| JP | 2008-011011 A | * | 1/2008 |
| WO | 2006/009021 A1 | | 1/2006 |
| WO | 2010/150882 A1 | | 12/2010 |
| WO | 2014/199674 A1 | | 12/2014 |

OTHER PUBLICATIONS

English language machine translation of JP 2008-011011 A, published Jan. 17, 2008, 8 pages. (Year: 2008).*
English language machine translation of JP 2007-174307 A, published Jul. 5, 2007, 24 pages. (Year: 2007).*
Official Communication issued in International Patent Application No. PCT/JP2016/070593, dated Oct. 4, 2016.

* cited by examiner

ELASTIC WAVE DEVICE

CROSS REFERENCE TO RELATED APPLICATIONS

This application claims the benefit of priority to Japanese Patent Application No. 2015-148832 filed on Jul. 28, 2015 and is a Continuation Application of PCT Application No. PCT/JP2016/070593 filed on Jul. 12, 2016. The entire contents of each application are hereby incorporated herein by reference.

BACKGROUND OF THE INVENTION

1. Field of the Invention

The present invention relates to an elastic wave device in which a longitudinally coupled resonator elastic wave filter is provided on a piezoelectric substrate.

2. Description of the Related Art

In an elastic wave device described in WO 2010/150882, interdigital transducer (IDT) electrodes and a ground-side wiring line are disposed on a piezoelectric substrate. The ground-side wiring line surrounds the IDT electrodes. A hot-side wiring line, which is connected to one of the IDT electrodes, three-dimensionally crosses the ground-side wiring line with an insulating film interposed therebetween.

In WO 2014/199674, a ground-side wiring line, which connects two longitudinally coupled resonator elastic wave elements to each other, and a hot-side wiring line, which connects another two longitudinally coupled resonator elastic wave elements to each other, cross each other with an insulating film interposed therebetween. In Japanese Unexamined Patent Application Publication No. 2004-282707, wiring lines that have different potentials cross each other with an insulating film interposed therebetween.

In elastic wave devices of the related art such as those described in WO 2010/150882, WO 2014/199674, and Japanese Unexamined Patent Application Publication No. 2004-282707, a three-dimensional crossing portion is provided in a portion spaced apart from the IDT electrodes. Consequently, the area of a piezoelectric substrate surface inevitably increases, and it is difficult to reduce the sizes of such elastic wave devices.

SUMMARY OF THE INVENTION

Preferred embodiments of the present invention provide elastic wave devices capable of reducing the area of a piezoelectric substrate surface and achieving a reduction in the size of the elastic wave device.

An elastic wave device according to a preferred embodiment of the present invention includes a piezoelectric substrate and a first longitudinally coupled resonator elastic wave filter that is disposed on the piezoelectric substrate and that includes at least three interdigital transducer (IDT) electrodes arranged in an elastic wave propagation direction. Each of the IDT electrodes includes a first busbar and a second busbar, the first busbar and the second busbar being respectively disposed on a first end side and a second end side in a direction perpendicular or substantially perpendicular to the elastic wave propagation direction. An inorganic insulating layer covers a plurality of the first busbars or a plurality of the second busbars on at least one of the first end side and the second end side. The elastic wave device further includes a first wiring line that is located above the plurality of first busbars or above the plurality of second busbars and disposed on the inorganic insulating layer so as to extend in the elastic wave propagation direction and a second wiring line that is disposed on the piezoelectric substrate so as to three-dimensionally crosses the first wiring line with the inorganic insulating layer interposed between the first wiring line and the second wiring line. The first wiring line is connected to the busbars among the plurality of first busbars or among the plurality of second busbars, the busbars being connected to the same potential, by extending through the inorganic insulating layer.

An elastic wave device according to a preferred embodiment of the present invention further includes an elastic wave element that is disposed on a side on which the plurality of second busbars of the first longitudinally coupled resonator elastic wave filter are disposed.

In an elastic wave device according to another preferred embodiment of the present invention, when the piezoelectric substrate is viewed in plan view, the first wiring line, which is located above the plurality of first busbars or above the plurality of second busbars and disposed on the inorganic insulating layer so as to extend in the elastic wave propagation direction, is superposed with the plurality of first busbars or the plurality of second busbars and does not project from the plurality of first busbars or the plurality of second busbars.

In an elastic wave device according to another preferred embodiment of the present invention, the elastic wave element is a second longitudinally coupled resonator elastic wave filter, and the second longitudinally coupled resonator elastic wave filter is cascade connected to the first longitudinally coupled resonator elastic wave filter. In this case, the area of an interstage region is able to be reduced.

In an elastic wave device according to another preferred embodiment of the present invention, the elastic wave element is an elastic wave resonator. In this case, the area of a region between the first longitudinally coupled resonator elastic wave filter and the elastic wave resonator is able to be reduced.

In an elastic wave device according to another preferred embodiment of the present invention, when a width direction of each of the first busbars or a width direction of each of the second busbars is parallel or substantially parallel to the direction perpendicular or substantially perpendicular to the elastic wave propagation direction, a width of the first wiring line is smaller than a width of each of the first busbars or a width of each of the second busbars. In this case, when the first wiring line is provided on the inorganic insulating layer, the degree of precision required to position the first wiring line in the width direction is able to be reduced. In addition, it is less likely that variations in an electrostatic capacitance between the first wiring line and the second wiring line will occur.

In an elastic wave device according to another preferred embodiment of the present invention, the busbars, which are connected to the same potential, are busbars that are connected to a ground potential, and the first wiring line is connected to the ground potential.

In an elastic wave device according to another preferred embodiment of the present invention, the first wiring line surrounds the first longitudinally coupled resonator elastic wave filter. In this case, the first longitudinally coupled resonator elastic wave filter is able to be electromagnetically shielded from the periphery of the first longitudinally coupled resonator elastic wave filter.

In an elastic wave device according to another preferred embodiment of the present invention, the first wiring line is a wiring line connected to a ground potential and surrounds the first longitudinally coupled resonator elastic wave filter and the elastic wave element. In this case, interference between the first longitudinally coupled resonator elastic wave filter and the elastic wave resonator and an element and an electrode positioned outside the wiring line is able to be reduced or prevented.

In an elastic wave device according to another preferred embodiment of the present invention, the first wiring line has a ring shape.

In an elastic wave device according to another preferred embodiment of the present invention, when the piezoelectric substrate is viewed in plan view, the first wiring line includes a cutout portion that enables the inside and the outside of the ring shape to communicate with each other.

In an elastic wave device according to another preferred embodiment of the present invention, the piezoelectric substrate is a $LiNbO_3$ substrate.

In an elastic wave device according to another preferred embodiment of the present invention, the inorganic insulating layer is disposed on the piezoelectric substrate so as to cover at least a plurality of the IDT electrodes of the first longitudinally coupled resonator elastic wave filter. Preferably, the inorganic insulating layer is made of silicon oxide. In this case, the absolute temperature coefficient of resonant frequency TCF of the elastic wave device is able to be decreased.

In elastic wave devices according to preferred embodiments of the present invention, the area of a piezoelectric substrate surface is able to be reduced, and a reduction in the size of the elastic wave device is able to be achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings to clarify the present invention.

Note that the preferred embodiments described in the present specification are examples, and it is to be noted that the configurations according to the different preferred embodiments may be partially replaced with one another or may be combined with each other.

Figure 1A:
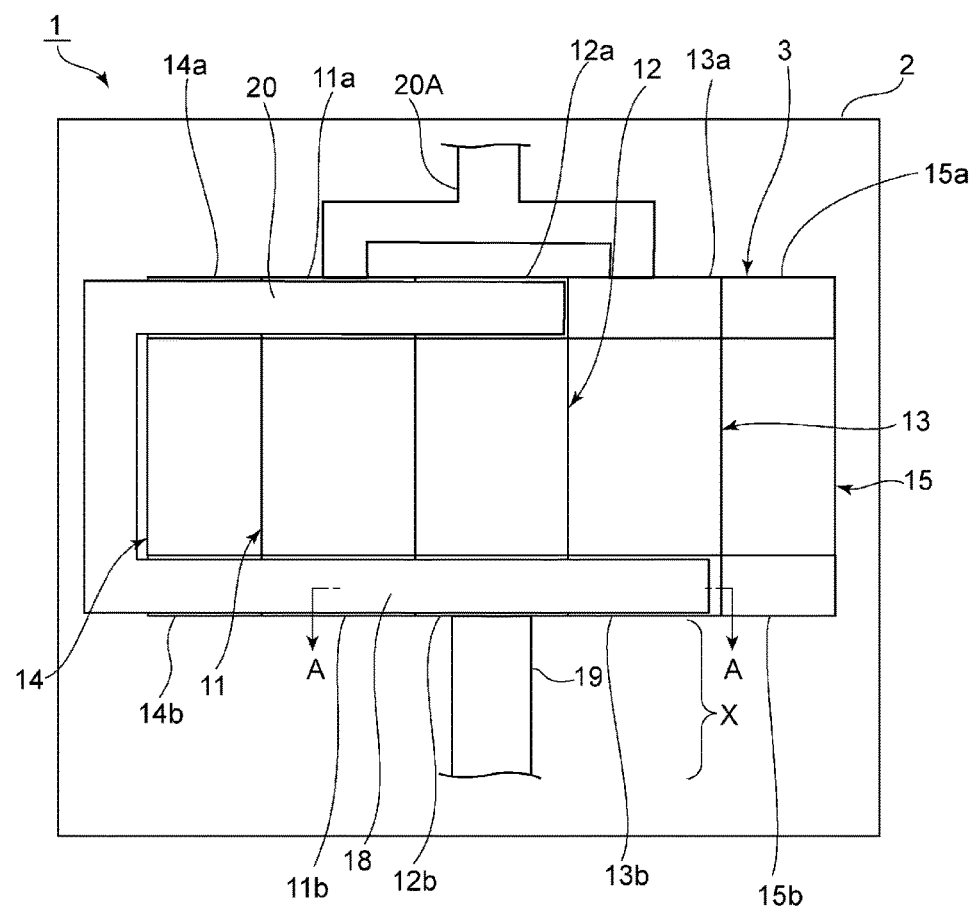
FIG. 1A is a schematic plan view of an elastic wave device according to a first preferred embodiment of the present invention.
Figure 1B:
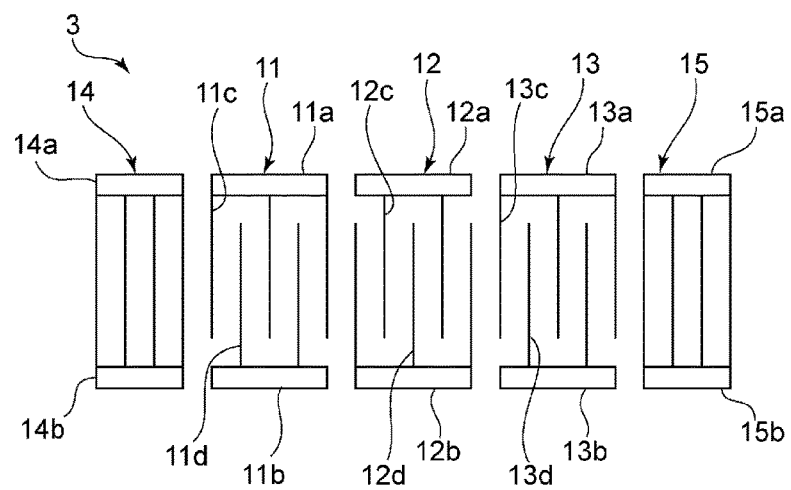
FIG. 1B is a schematic plan view illustrating an electrode structure of a longitudinally coupled resonator elastic wave filter.
Figure 2:
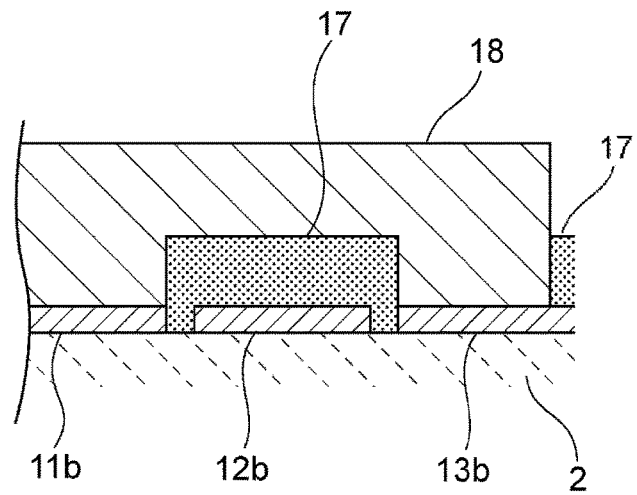
FIG. 2 is a cross-sectional view of a portion of the elastic wave device taken along line A-A of FIG. 1A.

FIG. 1A is a schematic plan view of an elastic wave device according to a first preferred embodiment of the present invention, and FIG. 1B is a schematic plan view illustrating an electrode structure of a longitudinally coupled resonator elastic wave filter according to the present preferred embodiment. FIG. 2 is a cross-sectional view of a portion of the elastic wave device taken along line A-A of FIG. 1A.

An elastic wave device 1 includes a piezoelectric substrate 2 including a main surface. The piezoelectric substrate 2 is preferably made of $LiNbO_3$, for example. The piezoelectric substrate 2 may be made of a piezoelectric single crystal, such as $LiTaO_3$, for example. In addition, the piezoelectric substrate 2 may have a structure in which a piezoelectric thin film is stacked on a plurality of multilayer films.

A first longitudinally coupled resonator elastic wave filter 3 is disposed on the main surface of the piezoelectric substrate 2. The first longitudinally coupled resonator elastic wave filter 3 includes first to third interdigital transducer (IDT) electrodes 11 to 13. In other words, the first longitudinally coupled resonator elastic wave filter 3 is preferably a three IDT longitudinally coupled resonator elastic wave filter, for example.

The first to third IDT electrodes 11 to 13 are arranged in an elastic wave propagation direction on the main surface of the piezoelectric substrate 2. Reflectors 14 and 15 are respectively disposed on a first side and a second side of a region in which the first to third IDT electrodes 11 to 13 are disposed in the elastic wave propagation direction.

FIG. 1A schematically illustrates the positions of the first to third IDT electrodes 11 to 13 and the positions of the reflectors 14 and 15. The electrode structures of the first to third IDT electrodes and the reflectors 14 and 15 are illustrated in more detail in FIG. 1B, which is a schematic diagram.

As illustrated in FIG. 1B, the first to third IDT electrodes 11 to 13 respectively include first busbars 11a, 12a, and 13a disposed at a first end thereof in a direction perpendicular or substantially perpendicular to the elastic wave propagation direction. In addition, second busbars 11b, 12b, and 13b are respectively disposed at a second end of the first to third IDT electrodes 11 to 13 in the direction perpendicular or substantially perpendicular to the elastic wave propagation direction. One end of each of a plurality of first electrode fingers 11c is connected to the first busbar 11a. One end of each of a plurality of first electrode fingers 12c is connected to the first busbar 12a. One end of each of a plurality of first electrode fingers 13c is connected to the first busbar 13a. One end of each of a plurality of second electrode fingers 11d is connected to the second busbar 11b. One end of each of a plurality of second electrode fingers 12d is connected to the second busbar 12b. One end of each of a plurality of second electrode fingers 13d is connected to the second busbar 13b.

In the direction perpendicular or substantially perpendicular to the elastic wave propagation direction, the reflector 14 includes a first busbar 14a, which is disposed at a first end thereof, and a second busbar 14b, which is disposed at a second end thereof, and the reflector 15 includes a first busbar 15a, which is disposed at a first end thereof, and a second busbar 15b, which is disposed at a second end thereof. The first busbar 14a and the second busbar 14b are short-circuited to each other by a plurality of electrode fingers. Similarly, the first busbar 15a and the second busbar 15b are short-circuited to each other by a plurality of electrode fingers. Note that the first busbars 14a and 15a and the second busbars 14b and 15b of the reflectors 14 and 15 may be omitted.

Although the materials of the first to third IDT electrodes 11 to 13 and the materials of the reflectors 14 and 15 are not particularly limited as long as the materials are conductive materials, metals, such as Al and Au, or alloys may preferably be used, for example.

As illustrated in FIG. 1B, the first busbars 11a, 12a, and 13a, each of which has an elongated strip shape extending in the elastic wave propagation direction, are arranged in the elastic wave propagation direction. The first busbar 14a and the first busbar 15a also extend linearly on an extension line that extends in the direction in which the first busbars 11a, 12a, and 13a extend.

Similarly, on the second end side in the direction perpendicular or substantially perpendicular to the elastic wave propagation direction, each of the second busbars 11b, 12b, and 13b has an elongated strip shape extending in the elastic wave propagation direction. Each of the second busbars 14b and 15b also has an elongated strip shape and is located on an extension line that extends in the direction in which the second busbars 11b, 12b, and 13b extend.

In the first longitudinally coupled resonator elastic wave filter 3, the first busbars 11a and 13a are connected to a signal potential, and the second busbar 11b and 13b are connected to a ground potential. In the second IDT electrode 12, the first busbar 12a is connected to the ground potential, and the second busbar 12b is connected to the signal potential.

In the related art, in a longitudinally coupled resonator elastic wave device, when wiring lines are provided on a piezoelectric substrate so as to be connected to other elements and connected to a ground potential, a large wiring space is required. In contrast, in the elastic wave device 1 according to the present preferred embodiment, such a wiring space is able to be reduced. This matter will now be described in more detail with reference to FIG. 3, FIG. 1A, and FIG. 2.

Figure 3:
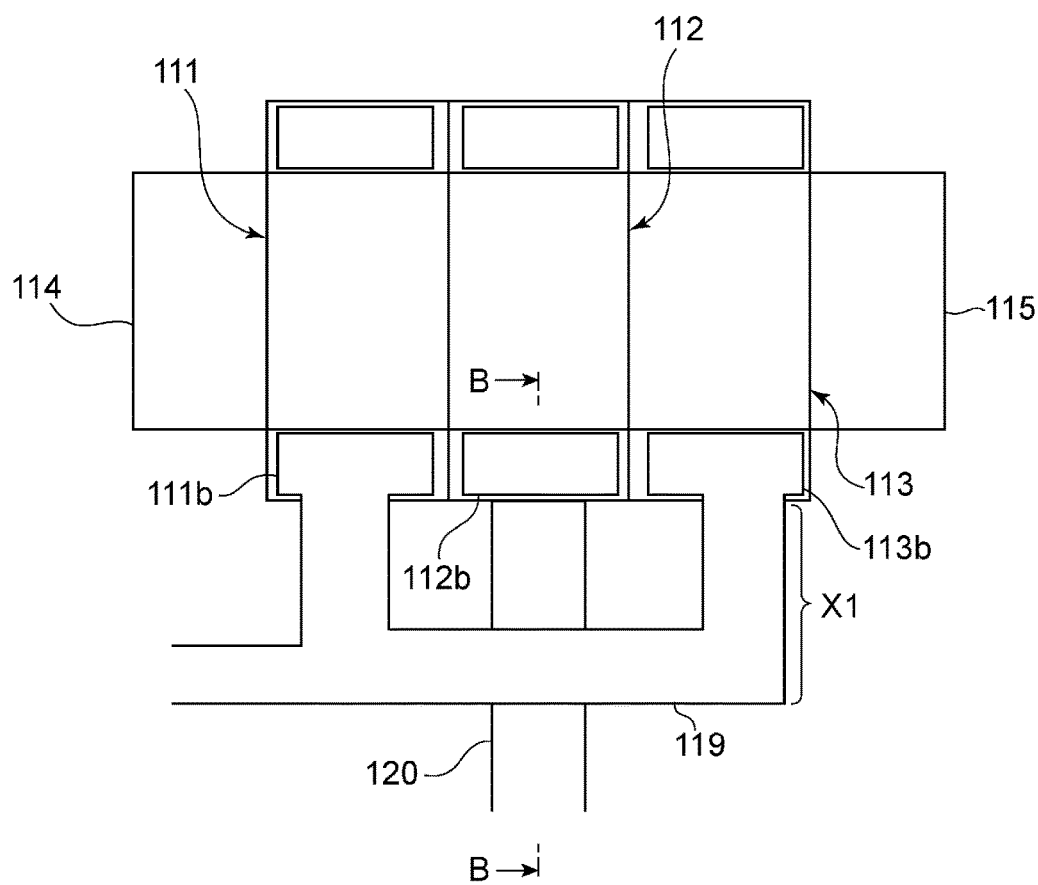
FIG. 3 is a schematic plan view illustrating an elastic wave device according to a first comparative example prepared for comparison.

FIG. 3 is a schematic plan view illustrating an example of an elastic wave device according to a first comparative example for describing a three-dimensional crossing portion of wiring lines in the related art. As illustrated in FIG. 3, first to third IDT electrodes 111 to 113 are configured in a similar manner to the first to third IDT electrodes 11 to 13 according to the present preferred embodiment. In addition, reflectors 114 and 115 are provided. The three-dimensional crossing portion is provided in the following manner, though.

Figure 4:
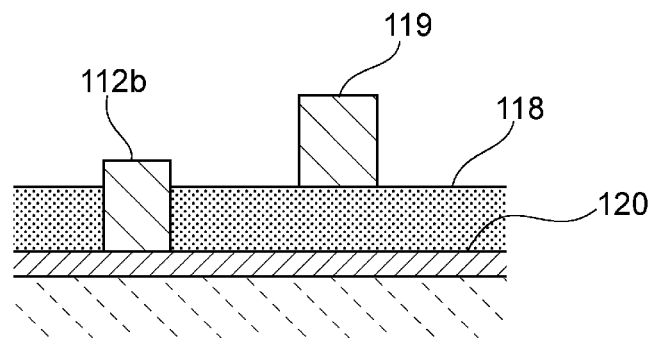
FIG. 4 is a cross-sectional view of a portion of the elastic wave device taken along line B-B of FIG. 3.

A signal wiring line 120 is connected to a second busbar 112b. An upper-layer wiring line 119 is connected to second busbars 111b and 113b, which are connected to a ground potential. Although not illustrated in FIG. 3, in practice, the upper-layer wiring line 119 is stacked on an inorganic insulating layer 118, as illustrated in FIG. 4. The inorganic insulating layer 118 prevents a short-circuit from occurring between the upper-layer wiring line 119 and the signal wiring line 120. As is clear from FIG. 3, a region indicated by X1 is required in order to provide the above-mentioned three-dimensional crossing portion.

In contrast, in the present preferred embodiment, although not illustrated in FIG. 1A, an inorganic insulating layer 17 is provided on the entire main surface of the piezoelectric substrate 2 so as to cover the electrode structure, as illustrated in FIG. 2. The inorganic insulating layer 17 is preferably made of silicon dioxide ($SiO_2$), for example. Various inorganic insulating materials, such as SiN, SiON, and $Al_2O_3$, for example, may be used as the material of the inorganic insulating layer. Preferably, the absolute temperature coefficient of resonant frequency TCF is able to be decreased by using $SiO_2$.

As illustrated in FIG. 2, in a region in which the second busbars 11b, 12b, and 13b are disposed, the second busbar 12b is coated with the inorganic insulating layer 17. In contrast, in portions in which the second busbar 11b and 13b are disposed, through holes are provided in the inorganic insulating layer 17. A first wiring line 18 is disposed on the inorganic insulating layer 17. The through holes are filled with the first wiring line 18, and the first wiring line 18 is electrically connected to the second busbar 11b and 13b. In the first longitudinally coupled resonator elastic wave filter 3, the first wiring line 18 commonly connects the second busbars 11b and 13b, which are connected to the same potential, to each other.

As illustrated in FIG. 1A, the first wiring line 18 extends in the elastic wave propagation direction and is located above the region in which the second busbars 11b, 12b, and 13b are disposed. As illustrated in FIG. 1A, a second wiring line 19 defining a signal wiring line extends to the second busbar 12b. The second wiring line 19 is coated with the inorganic insulating layer 17, and a short-circuit is prevented from occurring between the second wiring line 19 and the first wiring line 18. Note that the width of the wiring line in the elastic wave propagation direction, which is the length of the second wiring line 19, is preferably smaller than the length of the second busbar 12b.

As described above, in the longitudinally coupled resonator elastic wave filter 3, in the region in which the second busbars 11b, 12b, and 13b are disposed, the three-dimensional crossing of the first wiring line 18 connected to the ground potential and the second wiring line 19 connected to the signal potential is provided. Accordingly, it is not necessary to provide a three-dimensional crossing portion in a region indicated by X in FIG. 1A. Thus, the region indicated by X is able to be used for, for example, providing other elements. Therefore, the area of the piezoelectric substrate surface of the elastic wave device 1 is able to be reduced, and a reduction in the size of the elastic wave device 1 is facilitated.

Although the side on which the second busbars 11b, 12b, and 13b are disposed has been described above as an example, a first wiring line 20 is disposed on the inorganic insulating layer 17 in a region in which the first busbars 11a, 12a, and 13a are disposed. The first wiring line 20 is electrically connected to the first busbar 12a, which is connected to the ground potential. The first busbars 11a and 13a are electrically connected to a second wiring line 20A, which is integrally provided with the first busbars 11a and 13a. The second wiring line 20A is located below the inorganic insulating layer 17. The second wiring line 20A is connected to the signal potential.

Also on the side on which the first busbars 11a, 12a, and 13a are disposed, the three-dimensional crossing of the first wiring line 20 and the second wiring line 20A is achieved in the region in which the first busbars 11a, 12a, and 13a are disposed, and thus, in the direction perpendicular or substantially perpendicular to the elastic wave propagation direction, a region outside the region in which the first busbars 11a, 12a, and 13a are disposed is able to be reduced in a similar manner as described above.

Note that, in the present preferred embodiment, although the first three IDT, longitudinally coupled resonator elastic wave filter 3 is preferably provided, a longitudinally coupled resonator elastic wave filter that includes five or more IDT electrodes may also be provided, for example.

Figure 5:
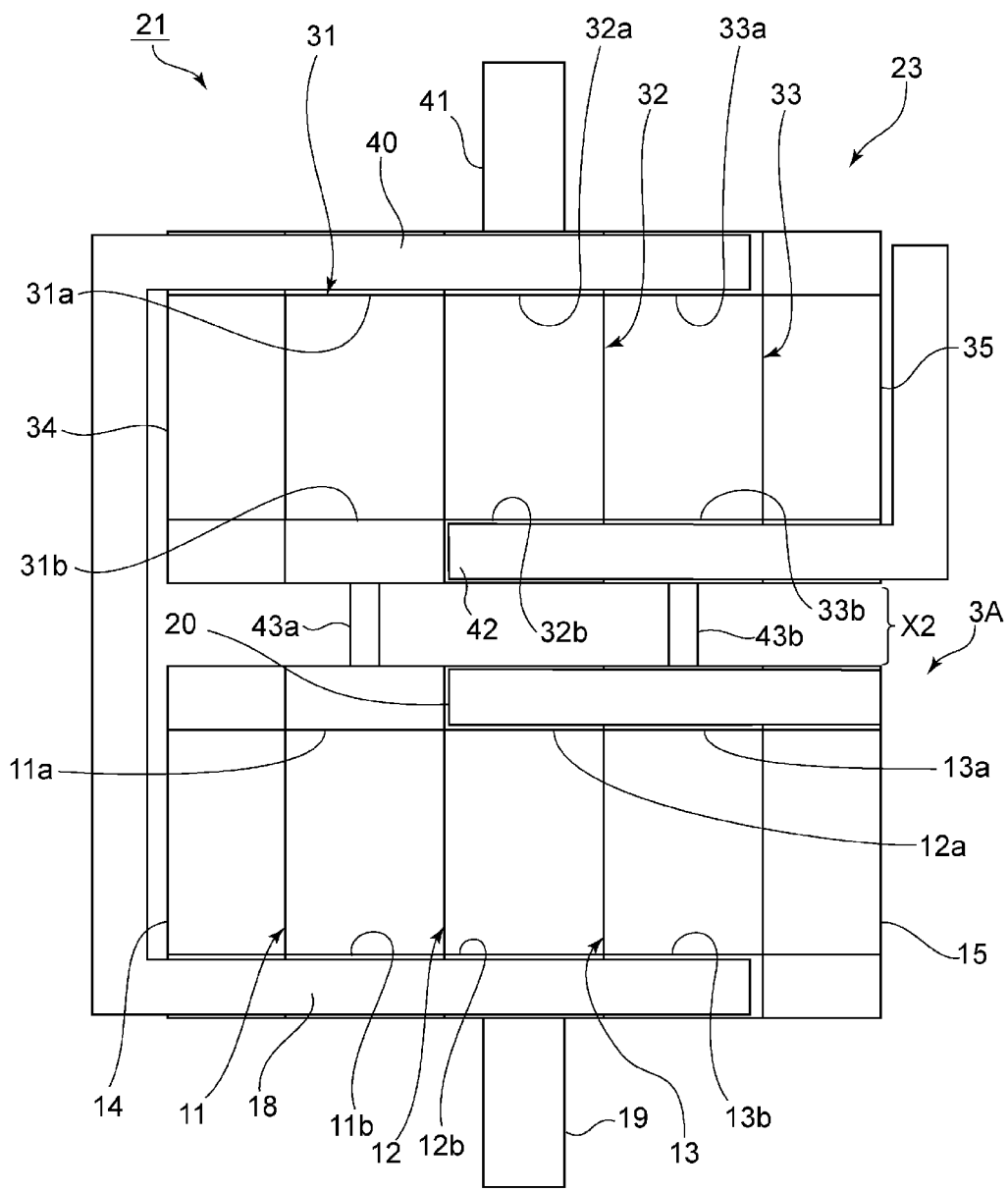
FIG. 5 is a schematic plan view of an elastic wave device according to a second preferred embodiment of the present invention.
Figure 6:
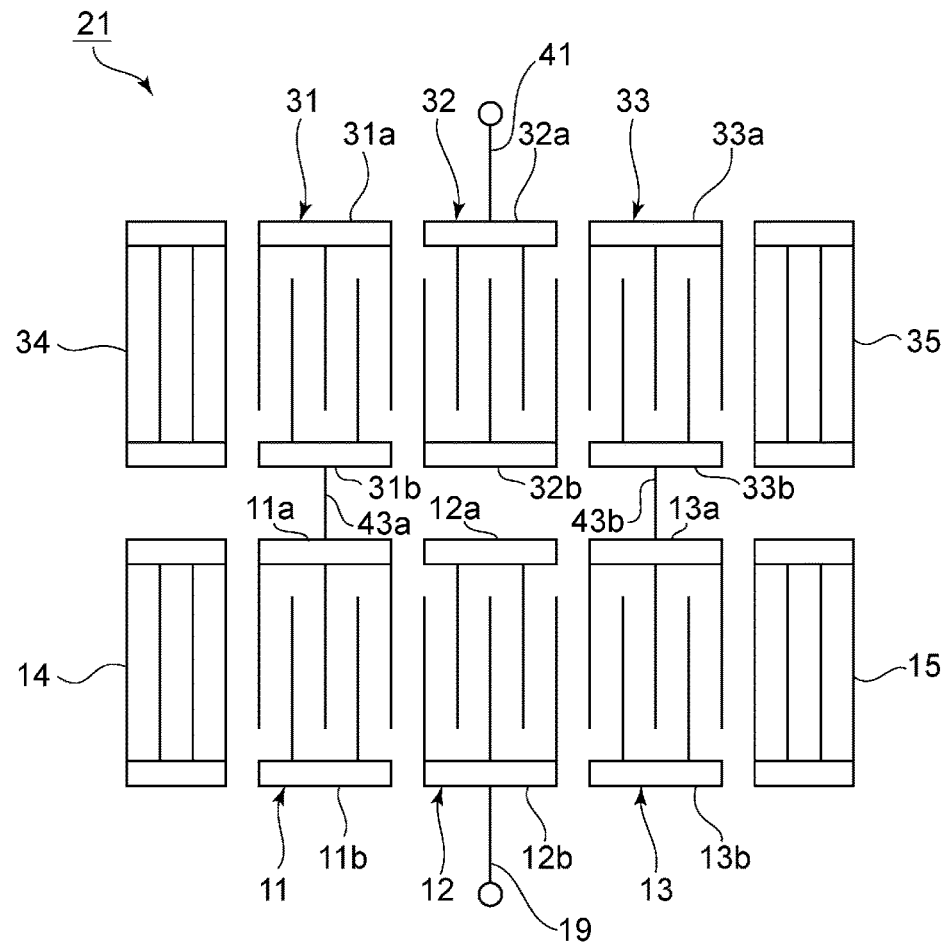
FIG. 6 is a schematic plan view illustrating an electrical connection structure between first and second longitudinally coupled resonator elastic wave filters according to the second preferred embodiment of the present invention.

FIG. 5 is a schematic plan view of an elastic wave device according to a second preferred embodiment of the present invention. FIG. 6 is a schematic plan view illustrating the electrode structure of an elastic wave device 21. The elastic wave device 21 includes a first longitudinally coupled resonator elastic wave filter 3A. The first longitudinally coupled resonator elastic wave filter 3A preferably has a configuration that is the same or substantially the same as that of the first longitudinally coupled resonator elastic wave filter 3. The first longitudinally coupled resonator elastic wave filter 3A and the second longitudinally coupled resonator elastic wave filter 23 are cascade-connected to each other such that an output signal of a second longitudinally coupled resonator elastic wave filter 23 corresponds to an input signal of the first longitudinally coupled resonator elastic wave filter 3A. The second longitudinally coupled resonator elastic wave filter 23 includes first to third IDT electrodes 31 to 33 and reflectors 34 and 35. First busbars 31a, 32a, and 33a of the first to third IDT electrodes 31 to 33 extend in the elastic wave propagation direction. A first wiring line 40 is disposed above a region in which the first busbars 31a, 32a, and 33a are disposed with an inorganic insulating layer, which is not illustrated in FIG. 5, interposed between the first wiring line 40 and the region. The first wiring line 40 and a second wiring line 41, which is connected to the signal potential, three-dimensionally cross each other with the inorganic insulating layer interposed therebetween. As illustrated in FIG. 5, second busbars 31b and 33b of the second longitudinally coupled resonator elastic wave filter 23, which is connected to an upstream stage are connected to second wiring lines 43a and 43b, respectively. The second wiring lines 43a and 43b are respectively electrically connected to the first busbars 11a and 13a of the first longitudinally coupled resonator-type elastic wave filter 3A, which is in a downstream stage.

The first longitudinally coupled resonator elastic wave filter 3A preferably has a structure that is the same or substantially the same as that of the first longitudinally coupled resonator elastic wave filter 3 according to the first preferred embodiment, except for the following. The first busbars 11a and 13a are connected to the second wiring lines 43a and 43b, respectively, and the second busbar 12b is connected to the ground potential. The first busbar 12a is electrically connected to the first wiring line 20, which is disposed on an inorganic insulating layer (not illustrated). The first wiring line 20 is connected to the ground potential.

The second wiring lines 43a and 43b respectively extend to the first busbars 11a and 13a below the inorganic insulating layer.

In the first longitudinally coupled resonator elastic wave filter 3A, the first wiring line 20 is located above the region in which the first busbars 11a, 12a, and 13a are disposed. In the second longitudinally coupled resonator elastic wave filter 23, a first wiring line 42 is located above a region in which the second busbars 31b, 32b, and 33b are disposed. Accordingly, three-dimensional crossing portions of the wiring lines are located not above an interstage region X2, but above the regions in which the corresponding busbars are provided. Thus, the distance between the upstream and downstream stages is able to be reduced. In other words, the second longitudinally coupled resonator elastic wave filter 23 is able to be located close to the first longitudinally coupled resonator elastic wave filter 3A. Therefore, also in the second preferred embodiment, a reduction in the size of the elastic wave device 21 is facilitated.

Figure 7:
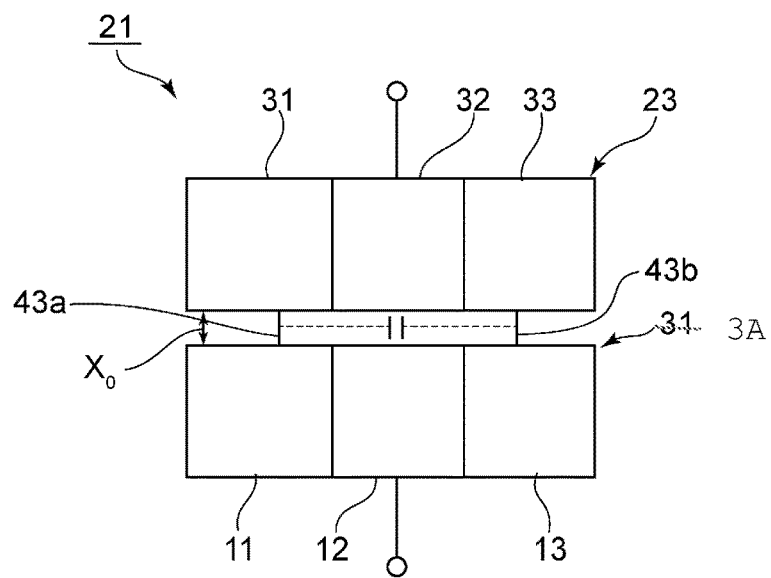
FIG. 7 is a schematic plan view of the elastic wave device according to the second preferred embodiment of the present invention.
Figure 8:
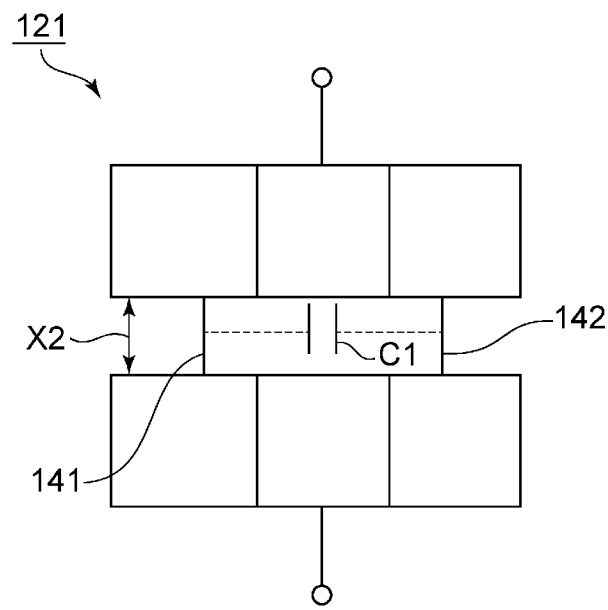
FIG. 8 is a schematic plan view of an elastic wave device according to a second comparative example prepared for comparison.

In addition, in the elastic wave device 21 according to the second preferred embodiment, pass band loss is able to be reduced. This matter will be described below in more detail. FIG. 7 is a schematic plan view of the elastic wave device according to the second preferred embodiment, and FIG. 8 is a schematic plan view of an elastic wave device according to a second comparative example. In the elastic wave device 21 according to the second preferred embodiment, the three-dimensional crossing portions are provided as described above. In contrast, in an elastic wave device 121 according to the second comparative example, which is illustrated in FIG. 8, similar to the above-described first comparative example, a three-dimensional crossing portion is provided outside a region in which busbars of a longitudinally coupled resonator elastic wave filter are disposed. Therefore, as is apparent by comparing FIG. 8 and FIG. 7, the interstage region X2 is larger than an interstage region $X_0$.

Figure 9:
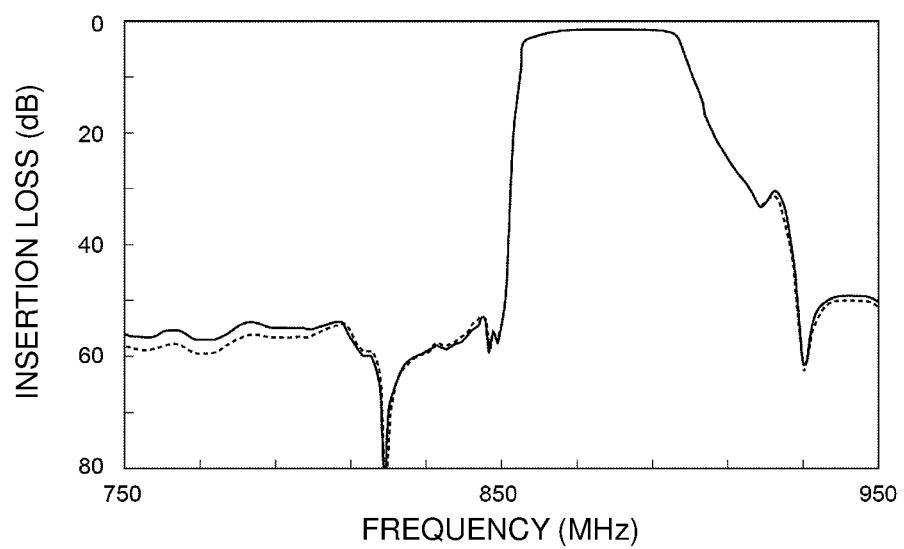
FIG. 9 is a graph illustrating attenuation frequency characteristics of the elastic wave device according to the second preferred embodiment of the present invention and attenuation frequency characteristics of the elastic wave device according to the second comparative example.
Figure 10:
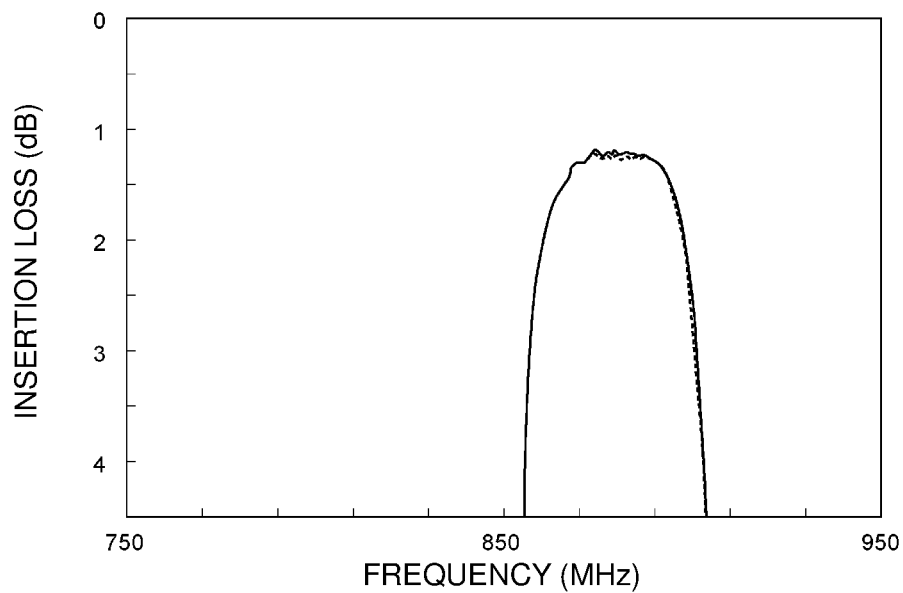
FIG. 10 is a graph illustrating, in an enlarged manner, the attenuation frequency characteristics of the elastic wave device according to the second preferred embodiment of the present invention and the attenuation frequency characteristics of the elastic wave device according to the second comparative example.

FIG. 9 is a graph illustrating attenuation frequency characteristics of the elastic wave device according to the second preferred embodiment and attenuation frequency characteristics of the elastic wave device according to the second comparative example, and FIG. 10 is a graph illustrating, in an enlarged manner, the attenuation frequency characteristics of each of the elastic wave devices in their pass band. In both FIG. 9 and FIG. 10, the result in the second preferred embodiment is indicated by a solid line, and the result in the second comparative example is indicated by a dashed line. As is clear from FIG. 9 and FIG. 10, it is understood that, in a range of about 859 MHz or more and about 894 MHz or less, which is the pass band, the maximum pass band loss in the second preferred embodiment is smaller than that in the second comparative example by about 0.02 dB, for example. This is presumably because the first and second longitudinally coupled resonator elastic wave filters 3A and 23 are close to each other, as illustrated in FIG. 7, and thus, parasitic capacitance generated between the wiring lines 41 and 42 is relatively small. It is assumed that since wiring lines 141 and 142 in the elastic wave device 121 according to the second comparative example are long, parasitic capacitance C1, which is illustrated in FIG. 8, is large. Therefore, according to the second preferred embodiment, it is assumed that a reduction in the loss is achieved as described above.

Figure 12:
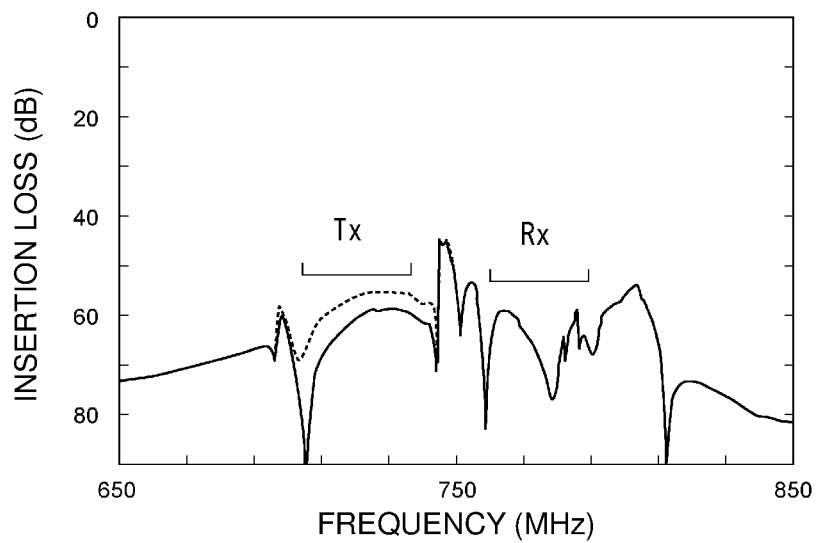
FIG. 12 is a graph illustrating isolation characteristics in the second preferred embodiment of the present invention and isolation characteristics in the second comparative example.
Figure 13:
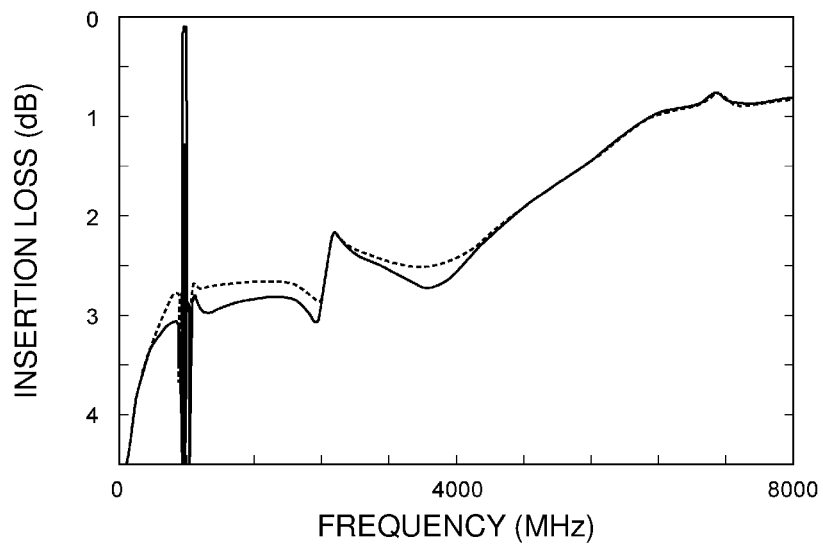
FIG. 13 is a graph illustrating the attenuation frequency characteristics of the elastic wave device according to the second preferred embodiment of the present invention and the attenuation frequency characteristics of the elastic wave device according to the second comparative example.

FIG. 12 and FIG. 13 are graphs respectively illustrating isolation characteristics and attenuation frequency characteristics of a duplexer that includes, as its reception filters, the elastic wave device 21 according to the second preferred embodiment and the elastic wave device 121 according to the second comparative example. In both FIG. 12 and FIG. 13, the result in the second preferred embodiment is indicated by a solid line, and the result in the second comparative example is indicated by a dashed line.

In FIG. 12, a transmission frequency band is indicated by Tx, and a reception frequency band is indicated by Rx.

Figure 11:
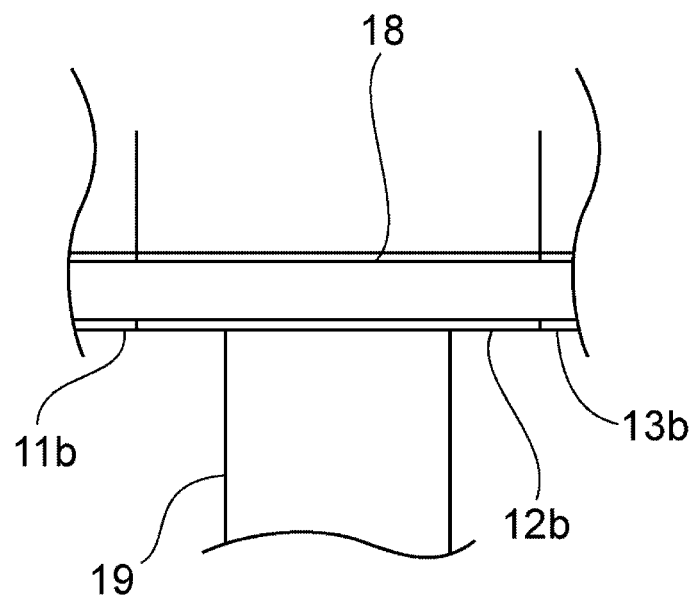
FIG. 11 is a partially enlarged plan view illustrating a portion at which an electrostatic capacitance is generated in the second comparative example.

It is understood that, in the transmission frequency band Tx, the isolation characteristics in the second preferred embodiment are significantly improved, whereas the isolation characteristics in the second comparative example are not significantly improved. As illustrated in FIG. 11, in the second preferred embodiment, an electrostatic capacitance is generated in a portion in which the first wiring line 18, which is preferably connected to, for example, the ground potential, is stacked on the second wiring line 19 with the inorganic insulating layer interposed therebetween. Here, the width direction of each of the first and second busbars 11a to 13b is parallel or substantially parallel to the direction perpendicular or substantially perpendicular to the elastic wave propagation direction. The width of each of the first and second busbars 11a to 13b corresponds to a dimension of each of the first and second busbars 11a to 13b in the width direction. The width of the second wiring line 19 also corresponds to a dimension of the second wiring line 19 in the width direction.

In this case, in the second preferred embodiment, it is preferable that the width of the first wiring line 18 be smaller than the width of the second busbar 12b. As a result, variations in the electrostatic capacitance are able to be reduced. Therefore, in the case in which the elastic wave device 21 is used as, for example, a reception filter as described above, the isolation characteristics due to variations in the electrostatic capacitance in the transmission frequency band are able to be improved.

Figure 14:
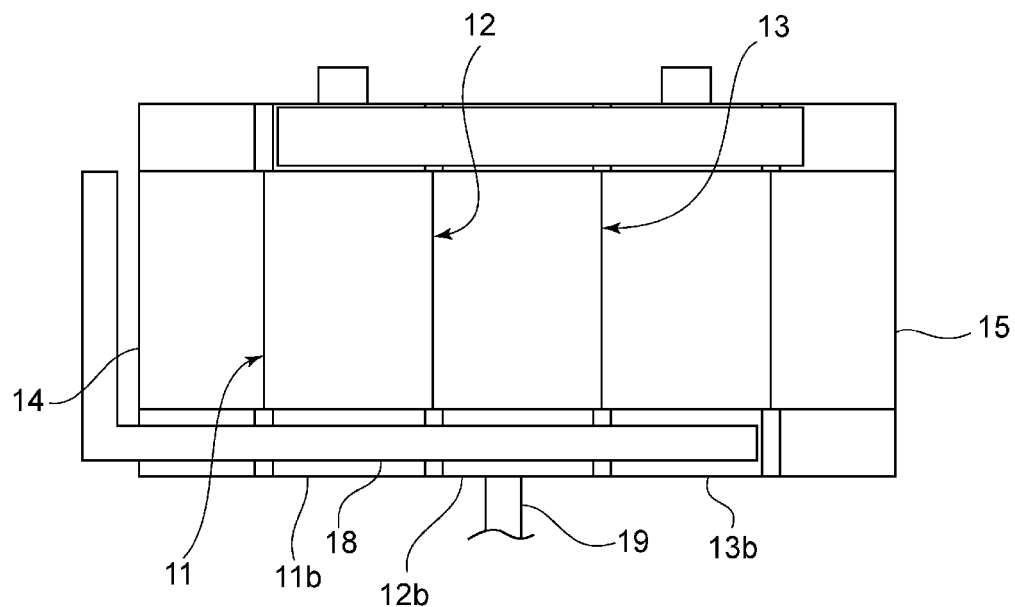
FIG. 14 is a schematic plan view of an elastic wave device according to a third preferred embodiment of the present invention.

In particular, as in the third preferred embodiment illustrated in FIG. 14, it is preferable that the first wiring line 18 be superposed with the second busbars 11b, 12b, and 13b and that the first wiring line 18 not project from the second busbars 11b, 12b, and 13b in the width direction when the piezoelectric substrate is viewed in plan view, and it is preferable that the width of the first wiring line 18 be smaller than the width of each of the second busbars 11b, 12b, and 13b. In this case, even if the position of the first wiring line 18 is displaced in the width direction or in the elastic wave propagation direction, there is an increase in the acceptable range of deviation at the location of the first wiring line 18 that causes the area in which the first wiring line 18 and the second busbars 11b, 12b, and 13b face each other to be constant, and thus, variations in the electrostatic capacitance are able to be reduced. Therefore, the isolation characteristics are able to be effectively improved. In addition, the tolerance for the position at which the first wiring line 18 is provided is increased.

Figure 15:
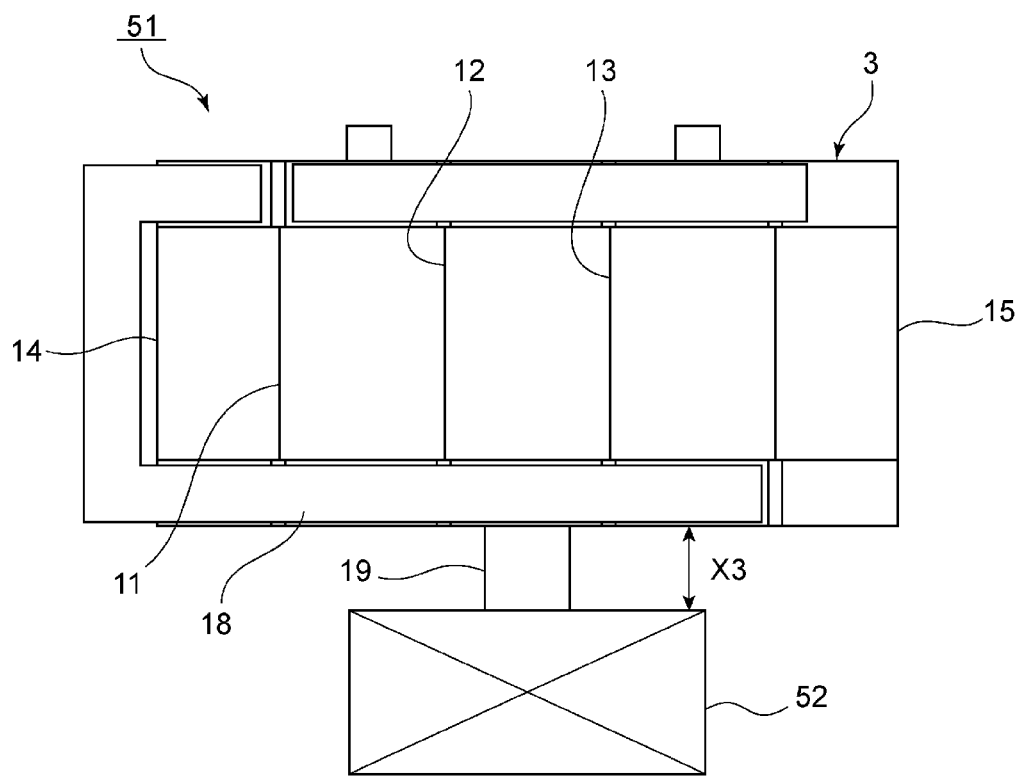
FIG. 15 is a schematic plan view of an elastic wave device according to a fourth preferred embodiment of the present invention.

FIG. 15 is a schematic plan view of an elastic wave device according to a fourth preferred embodiment of the present invention. In an elastic wave device 51, an elastic wave resonator 52 is connected to the first longitudinally coupled resonator elastic wave filter 3. The rest of the configuration of the elastic wave device 51 according to the fourth preferred embodiment is the same or substantially the same as that of the elastic wave device 1 according to the first preferred embodiment. In the present preferred embodiment, wiring lines three-dimensionally cross each other in the same or substantially the same manner as the first preferred embodiment. Thus, a distance X3 between the first longitudinally coupled resonator elastic wave filter 3 and the elastic wave resonator 52, which is disposed on the piezoelectric substrate 2, is able to be reduced. Therefore, the area of the piezoelectric substrate 2 is able to be reduced, and a reduction in the size of the elastic wave device 51 is facilitated.

As is clear from the fourth preferred embodiment, in elastic wave devices according to preferred embodiments of the present invention, various elastic wave elements, such as a longitudinally coupled resonator elastic wave filter and an elastic wave resonator, may be connected to the longitudinally coupled resonator elastic wave filter.

Figure 16:
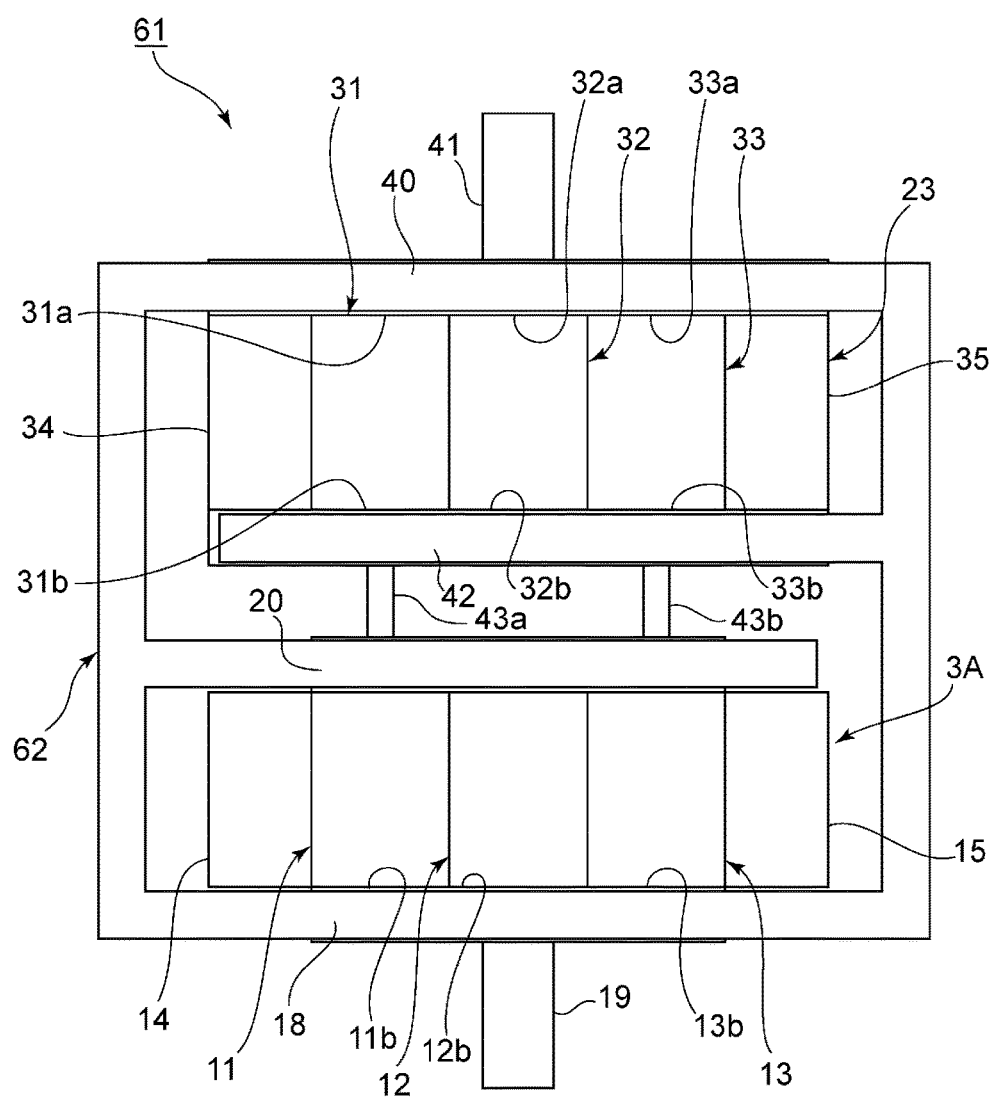
FIG. 16 is a schematic plan view of an elastic wave device according to a fifth preferred embodiment of the present invention.

FIG. 16 is a schematic plan view of an elastic wave device according to a fifth preferred embodiment of the present invention. An elastic wave device 61 according to the fifth preferred embodiment is configured in the same or substantially the same manner as the elastic wave device 21 according to the second preferred embodiment. In the elastic wave device 61, a first wiring line 62, which is connected to a ground potential, surrounds a region in which the first and second longitudinally coupled resonator elastic wave filter 3A and 23 are disposed. The first wiring line 62 preferably has a rectangular or substantially rectangular frame shape, for example. The first wiring lines 18 and 40 are included in the first wiring line 62, which preferably has a rectangular or substantially rectangular frame shape, for example. The first wiring line 62 extends to the first wiring lines 20 and 42. The first wiring line 42 is located above the second busbars 31b, 32b, and 33b and extends on an inorganic insulating layer in the elastic wave propagation direction. In this manner, it is preferable that the first wiring line 62, which is connected to the ground potential, has a ring shape surrounding the region in which the longitudinally coupled resonator elastic wave filters 3A and 23 are disposed. As a result, the longitudinally coupled resonator elastic wave filters 3A and 23 are able be electromagnetically shielded from the peripheral elements and circuits.

Figure 17:
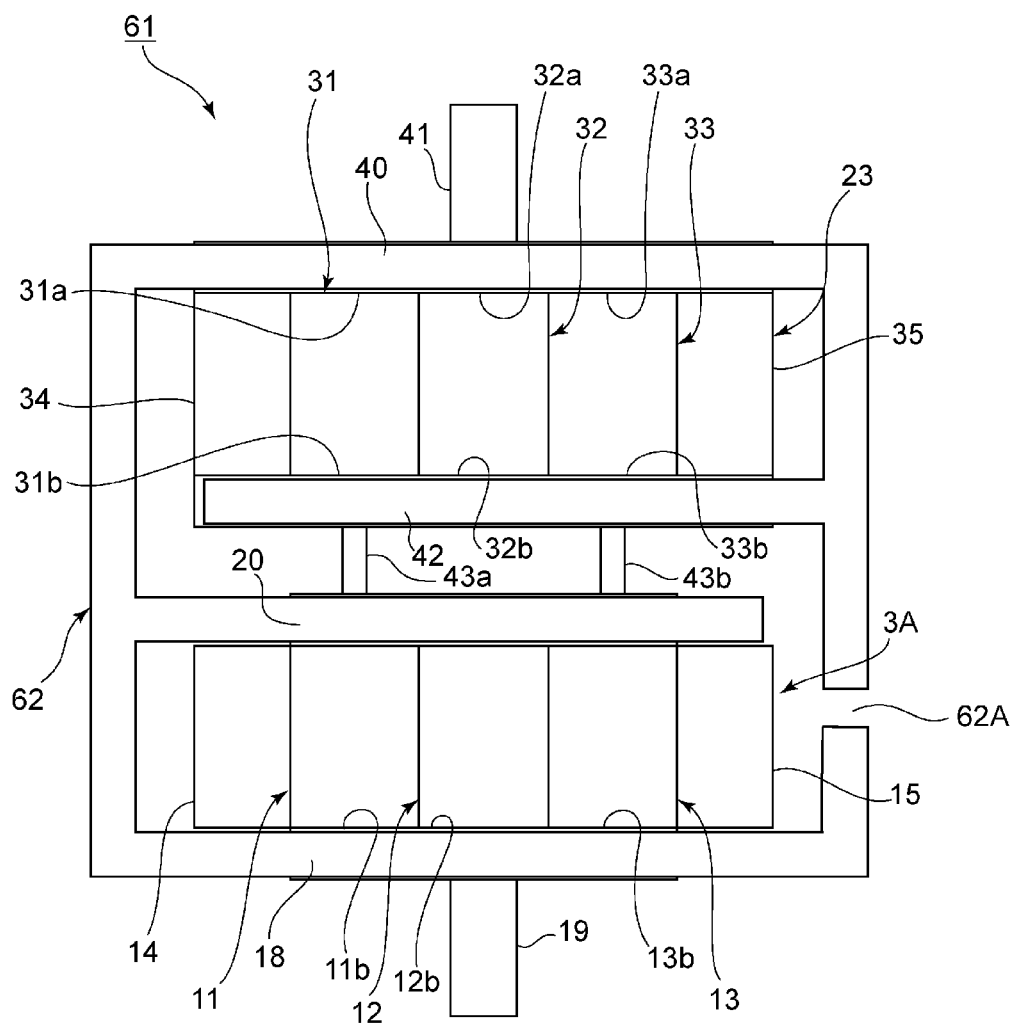
FIG. 17 is a schematic plan view illustrating a modification of the elastic wave device according to the fifth preferred embodiment of the present invention.

In addition, as illustrated in FIG. 17, a cutout portion 62A may be provided in a portion of the first wiring line 62, which has the ring shape surrounding the region in which the longitudinally coupled resonator elastic wave filters 3A and 23 are disposed, the cutout portion 62A enabling the inside and the outside of the ring to communicate with each other. In this case, when the first wiring line 62 is provided by photolithography, a photoresist is able to be easily separated. Thus, the first wiring line 62 that provides the electromagnetic shielding function is able to be easily formed. In this case, when the piezoelectric substrate 2 is viewed in plan view, it is preferable that the cutout portion 62A be provided in the first wiring line 62 having a ring shape and that the first wiring line 62 not have a closed cavity provided inside the ring.

Figure 18:
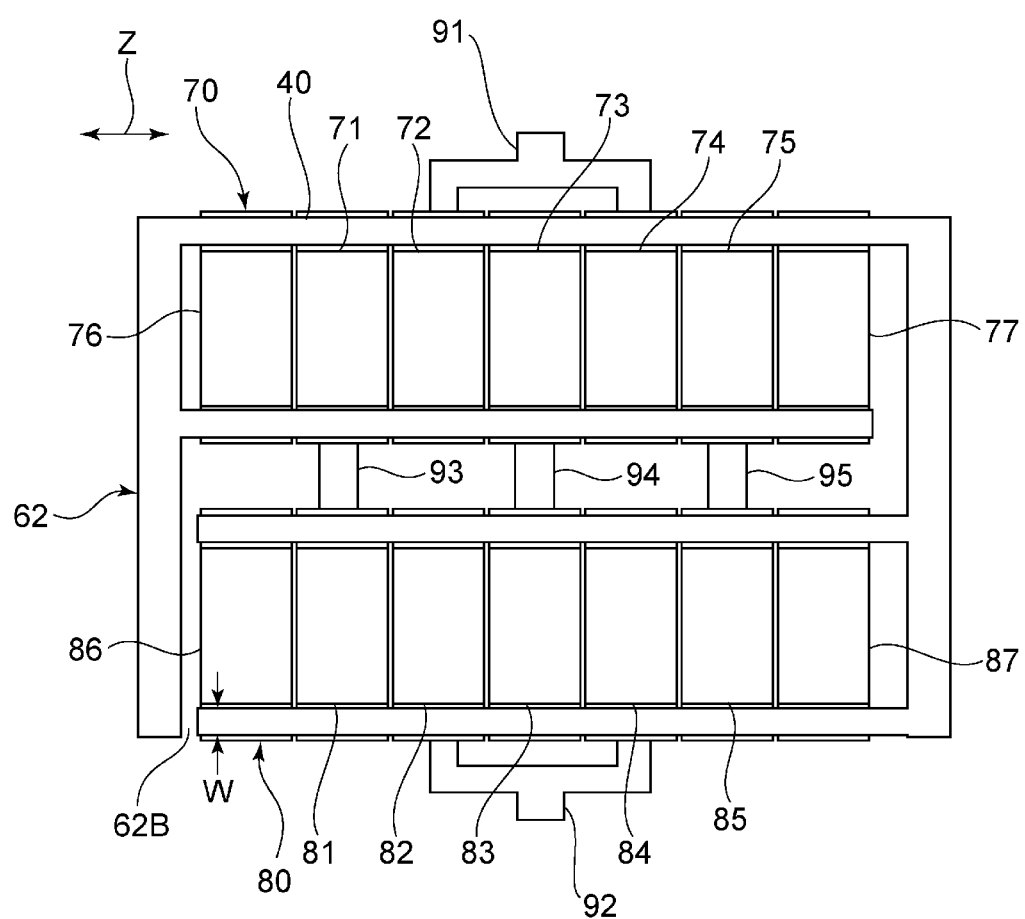
FIG. 18 is a schematic plan view illustrating another modification of the elastic wave device according to the fifth preferred embodiment of the present invention.

As illustrated in FIG. 18, it is also preferable that each of two first and second longitudinally coupled resonator elastic wave filters 70 and 80 be a five-IDT longitudinally coupled resonator elastic wave filters. The first longitudinally coupled resonator elastic wave filter 70 includes first to fifth IDT electrodes 71 to 75 arranged in an elastic wave propagation direction. In addition, reflectors 76 and 77 are arranged at opposite ends in the elastic wave propagation direction. The elastic wave propagation direction corresponds to the direction indicated by Z in FIG. 18.

The first longitudinally coupled resonator elastic wave filter 70 is connected to an unbalanced input terminal 91. In other words, the unbalanced input terminal 91 is connected to one end of each of the IDT electrodes 72 and 74. One end of each of the IDT electrodes 71, 73, and 75 is connected to the first wiring line 40. The first wiring line 40 is connected to the one end of each of the IDT electrodes 71, 73, and 75 via through holes, which are provided in the inorganic insulating layer. Similarly, one end of each of the reflectors 76 and 77 is connected to the first wiring line 40.

As in the case illustrated in FIG. 16, the first wiring line 40 is included in the first wiring line 62, which preferably has a rectangular or substantially rectangular frame shape, for example. The first wiring line 62 is connected to a reference potential or a ground potential.

The second longitudinally coupled resonator elastic wave filter 80 is cascade-connected to the first longitudinally coupled resonator elastic wave filter 70. The second longitudinally coupled resonator elastic wave filter 80 includes IDT electrodes 81 to 85 arranged in the elastic wave propagation direction. In addition, reflectors 86 and 87 are arranged at opposite ends in the elastic wave propagation direction. An output end of the second longitudinally coupled resonator elastic wave filter 80 is connected to an unbalanced output terminal 92. More specifically, one end of each of the IDT electrodes 82 and 84 is connected to the unbalanced output terminal 92. One end of each of the IDT electrodes 81, 83, and 85 is connected to the ground potential, that is, to the first wiring line 62, which preferably has a rectangular or substantially rectangular frame shape, for example. In other words, the first wiring line 62 is electrically connected to one of the busbars of each of the IDT electrodes 81, 83, and 85 by extending through the through holes provided in the inorganic insulating layer (not illustrated).

Each of the busbars, which extend to the unbalanced input terminal 91 and the unbalanced output terminal 92 or extend to one of the unbalanced input terminal 91 and the unbalanced output terminal 92, and the first wiring line 62 three-dimensionally cross each other with the inorganic insulating layer interposed therebetween on the input end side and the output end side. Therefore, also in the present preferred embodiment, a space on the input end side and a space on the output end side are able to be reduced.

In an interstage region, the busbars of the IDT electrodes 71, 73, and 75 of the first longitudinally coupled resonator elastic wave filter 70 and the busbars of the IDT electrodes 81, 83, and 85 of the second longitudinally coupled resonator elastic wave filter 80 are electrically connected to each other by second wiring lines 93 to 95 defining interstage connection wiring lines.

The first wiring line 62 is electrically connected to the busbars of the IDT electrodes 72, 74, 82, and 84, the busbars being located on the side on which the interstage region is provided. In other words, the first wiring line 62 is electrically connected to the busbars of the IDT electrodes 72, 74, 82, and 84 on the side on which the interstage region is provided by extending through the through holes provided in the inorganic insulating layer. Therefore, also in the interstage region, the busbars, which are connected to the second wiring lines 93 to 95 or a signal potential, and the first wiring line 62 three-dimensionally cross each other in the region in which the busbars are provided, and thus, space saving is achieved.

The first wiring line 62 is connected to the reference potential or the ground potential.

The connection between the first wiring line 62 and the reference potential is provided by connecting the first wiring line 62 to a reference potential provided in or on a substrate in or on which the elastic wave device is to be mounted. Although the overall shape of the first wiring line 62 is preferably a ring shape, for example, the first wiring line 62 includes, in a portion thereof, a cutout portion 62B defining a slit. Therefore, when the first wiring line 62 is formed by photolithography, a photoresist is able to be easily separated.

When the piezoelectric substrate is viewed in plan view, it is preferable that the length of the above-mentioned 62B in the Z direction in FIG. 18, that is, the length of the slit be five-fold or less the line width of the first wiring line 62, for example. Here, the line width is a dimension W in a direction perpendicular or substantially perpendicular to the direction in which the first wiring line 62 having a ring shape extends annularly. In the case in which the length of the cutout portion 62B in the direction in which a ring-shaped portion of the first wiring line 62 extends is preferably about 10 μm or more, for example, and is five-fold or less the line width W of the first wiring line 62, a photoresist is able to be further easily separated while the electromagnetic shielding function is sufficiently provided.

Note that the combination of the input and output terminals of the elastic wave device is not limited to unbalanced-unbalanced and may be unbalanced-balanced or balanced-unbalanced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric substrate; and
    a first longitudinally coupled resonator elastic wave filter that is disposed on the piezoelectric substrate and that includes at least three interdigital transducer (IDT) electrodes arranged in an elastic wave propagation direction; wherein
    each of the IDT electrodes includes a first busbar and a second busbar, the first busbar and the second busbar being respectively disposed on a first end side and a second end side in a direction perpendicular or substantially perpendicular to the elastic wave propagation direction;

an inorganic insulating layer covers a plurality of the first busbars or a plurality of the second busbars on at least one of the first end side and the second end side;

the elastic wave device further includes:
- a first wiring line that is located above the plurality of first busbars or above the plurality of second busbars and disposed on the inorganic insulating layer so as to extend in the elastic wave propagation direction;
- a second wiring line that is disposed on the piezoelectric substrate so as to three-dimensionally cross the first wiring line with the inorganic insulating layer interposed between the first wiring line and the second wiring line; and
- an elastic wave element that is disposed on a side on which the plurality of second busbars of the first longitudinally coupled resonator elastic wave filter are disposed;

the first wiring line is connected to the busbars among the plurality of first busbars or among the plurality of second busbars, the busbars being connected to a same potential, by extending through the inorganic insulating layer; and the first wiring line is a wiring line connected to a ground potential and surrounds the first longitudinally coupled resonator elastic wave filter and the elastic wave element.

2. The elastic wave device according to claim 1, wherein when the piezoelectric substrate is viewed in plan view, the first wiring line, which is located above the plurality of first busbars or above the plurality of second busbars and disposed on the inorganic insulating layer so as to extend in the elastic wave propagation direction, is superposed with the plurality of first busbars or the plurality of second busbars and does not project from the plurality of first busbars or the plurality of second busbars in at least one direction.

3. The elastic wave device according to claim 1, wherein
the elastic wave element is a second longitudinally coupled resonator elastic wave filter; and
the second longitudinally coupled resonator elastic wave filter is cascade-connected to the first longitudinally coupled resonator elastic wave filter.

4. The elastic wave device according to claim 1, wherein the elastic wave element is an elastic wave resonator.

5. The elastic wave device according to claim 1, wherein, when a width direction of each of the first busbars or a width direction of each of the second busbars is parallel or substantially parallel to the direction perpendicular or substantially perpendicular to the elastic wave propagation direction, a width of the first wiring line is smaller than a width of each of the first busbars or a width of each of the second busbars.

6. The elastic wave device according to claim 1, wherein the busbars, which are connected to the same potential, are busbars that are connected to the ground potential.

7. The elastic wave device according to claim 1, wherein the first wiring line has a ring shape.

8. The elastic wave device according to claim 7, wherein, when the piezoelectric substrate is viewed in plan view, the first wiring line includes a cutout portion that enables an inside and an outside of the ring shape to communicate with each other.

9. The elastic wave device according to claim 7, wherein the ring shape is rectangular or substantially rectangular.

10. The elastic wave device according to claim 1, wherein the piezoelectric substrate is a $LiNbO_3$ substrate.

11. The elastic wave device according to claim 1, wherein the piezoelectric substrate is a $LiTaO_3$ substrate.

12. The elastic wave device according to claim 1, wherein the inorganic insulating layer is disposed on the piezoelectric substrate so as to cover at least a plurality of the IDT electrodes of the first longitudinally coupled resonator-type elastic wave filter.

13. The elastic wave device according to claim 1, wherein the inorganic insulating layer is made of silicon oxide.

14. The elastic wave device according to claim 1, wherein the inorganic insulting layer is made of SiN, SiON, or $Al_2O_3$.

15. The elastic wave device according to claim 1, wherein the inorganic layer includes through holes through which the first wiring line extends.

\* \* \* \* \*